US012763780B2

(12) United States Patent
Lee et al.

(10) Patent No.: US 12,763,780 B2
(45) Date of Patent: Oct. 13, 2026

(54) DEVICE AND METHOD FOR MULTI-CHIP CLOCK SYNCHRONIZATION

(71) Applicant: LX SEMICON CO., LTD., Daejeon (KR)

(72) Inventors: Jae Hwan Lee, Daejeon (KR); Yoon Hoe Kim, Daejeon (KR); Ji Hye Kim, Daejeon (KR); Seung Chan Jung, Daejeon (KR); Hyun Soo Chung, Daejeon (KR)

(73) Assignee: LX SEMICON CO., LTD., Daejeon (KR)

( * ) Notice: Subject to any disclaimer, the term of this patent is extended or adjusted under 35 U.S.C. 154(b) by 159 days.

(21) Appl. No.: 18/518,733

(22) Filed: Nov. 24, 2023

(65) Prior Publication Data

US 2024/0178848 A1 May 30, 2024

(30) Foreign Application Priority Data

Nov. 25, 2022 (KR) ........................ 10-2022-0160484
Nov. 1, 2023 (KR) ........................ 10-2023-0149512

(51) Int. Cl.
*H03L 7/083* (2006.01)
*H03L 7/093* (2006.01)
*H03L 7/107* (2006.01)

(52) U.S. Cl.
CPC .............. *H03L 7/083* (2013.01); *H03L 7/093* (2013.01); *H03L 7/1077* (2013.01)

(58) Field of Classification Search
CPC ........ H03L 7/1077; H03L 7/093; H03L 7/083
See application file for complete search history.

(56) References Cited

U.S. PATENT DOCUMENTS 5,691,660 A * 11/1997 Busch ........................ G06F 1/10 327/147
6,118,314 A * 9/2000 Arnould ................ H04J 3/0685 327/198

(Continued)

OTHER PUBLICATIONS

Extended European Search Report dated Apr. 30, 2024, issued for the corresponding European patent application No. 23211694.7, 9 pages.

*Primary Examiner* — Nimesh G Patel
(74) *Attorney, Agent, or Firm* — ROTHWELL, FIGG, ERNST & MANBECK, P.C.

(57) ABSTRACT

The present disclosure relates to a multi-chip clock synchronization device and a method capable of reducing an operating frequency and power consumption when a plurality of chips share clocks for multi-chip clock synchronization, which may include a reference clock supply unit connected to a plurality of chips and supplying a reference clock of a first frequency to each chip and a target clock generation unit generating a target clock of a second frequency based on the reference clock of the first frequency, wherein the reference clock supply unit may generate the reference clock of the first frequency which is N times lower than the second frequency of the target clock to supply the generated reference clock to each chip, and the target clock generation unit may multiply the first frequency of the reference clock by N times when the reference clock of the first frequency is input to generate the target clock of the second frequency.

20 Claims, 11 Drawing Sheets

(56) References Cited

U.S. PATENT DOCUMENTS

| | | | | |
|---|---|---|---|---|
| 8,775,856 | B1 * | 7/2014 | An | G06F 1/06 713/400 |
| 2014/0167825 | A1 * | 6/2014 | Dobbs | G06F 1/04 327/158 |
| 2019/0131981 | A1 * | 5/2019 | Vaucher | H03L 7/185 |
| 2020/0382107 | A1 * | 12/2020 | Zhao | H03K 5/00006 |

* cited by examiner

DEVICE AND METHOD FOR MULTI-CHIP CLOCK SYNCHRONIZATION

CROSS-REFERENCE TO RELATED APPLICATIONS

This application claims priority from Republic of Korea Patent Application Nos. 10-2022-0160484, filed on Nov. 25, 2022, and 10-2023-0149512, filed on Nov. 1, 2023, both of which are incorporated herein by reference in their entirety.

TECHNICAL FIELD

The present disclosure relates to a multi-chip clock synchronization device and a method capable of reducing an operating frequency and power consumption when a plurality of chips share clocks for multi-chip clock synchronization.

BACKGROUND

In general, a display panel may be composed of a number of pixels arranged in a matrix form, each pixel may be composed of a sub-pixel such as R (red), G (green), and B (blue), and each sub-pixel may display an image on the display panel while emitting light in a grayscale corresponding to image data.

Recently, display panels have gradually become larger, and as the display panels have become larger, a number of driving chips in the display panels has also increased to support high resolution and high frame rates.

As such, in the case of devices using multiple chips, such as display panels and touch panels, clock signal generation and clock signal synchronization between chips of the multiple chips are emerging as important issues to increase operation speed.

As a clock sharing method for clock signal synchronization, a method in which, when an external oscillator generates a clock, the same clock is supplied to chips of the multiple chips such that the plurality of chips share a clock source, has been used in the related art.

However, such a method in the related art had a problem that it is disadvantageous in terms of cost because of using external oscillation elements, and input/output operating frequency and power consumption increase because multiple chips share oscillation frequency.

In addition, as another clock sharing method for clock signal synchronization, a method in which, when an oscillator inside a master chip generates a clock, the same clock is supplied to a plurality of slave chips so that the plurality of slave chips share a clock source, has been used in the related art.

However, such a method also had a problem that the input/output operating frequency and power consumption increase because the slave chips share the oscillation frequency.

Therefore, it is necessary to develop a multi-chip clock synchronization device capable of reducing input/output operation frequency and power consumption in the future.

SUMMARY

Technical Problem

The present disclosure is directed to solving the above-described problems and other problems.

The present disclosure is directed to providing a multi-chip clock synchronization device and method capable of reducing input/output operating frequency and power consumption when performing clock synchronization by individually supplying a reference clock of a low frequency to each chip of multiple chips and multiplying the low frequency of the reference clock in each chip by N times to generate and share a target clock.

Technical Solution

A multi-chip clock synchronization device according to an embodiment of the present disclosure may include a reference clock supply unit connected to a plurality of chips and supplying a reference clock of a first frequency to each chip and a target clock generation unit generating a target clock of a second frequency based on the reference clock of the first frequency, wherein the reference clock supply unit may generate the reference clock of the first frequency which is N times lower than the second frequency of the target clock to supply the generated reference clock to each chip, and the target clock generation unit may multiply the first frequency of the reference clock by N times when the reference clock of the first frequency is input to generate the target clock of the second frequency.

A multi-chip clock synchronization method according to an embodiment of the present disclosure is a multi-chip clock synchronization method of a device including a reference clock supply unit and a target clock generation unit, the method may include generating a reference clock of a first frequency which is N times lower than a second frequency of a target clock, by the reference clock supply unit, supplying the reference clock of the first frequency to each chip of multiple chips, by the reference clock supply unit, generating the target clock of the second frequency by multiplying the low frequency of the reference clock in each chip by N times when the reference clock of the first frequency is input to each chip, by the target clock generation unit, and synchronizing clocks of the multiple chips based on the target clock of the second frequency, by the target clock generation unit.

A display device according to an embodiment of the present disclosure may include a touch panel in which a plurality of touch sensors are disposed, a touch driving device that drives the touch sensor, and a multi-chip clock synchronization device that applies a target clock to multiple chips of the touch driving device to synchronize clocks of the multiple chips, wherein the multi-chip clock synchronization device may include a reference clock supply unit connected to a plurality of chips and supplying a reference clock of a first frequency to each chip and a target clock generation unit that generates a target clock of a second frequency based on the reference clock of the first frequency input to each chip, the reference clock supply unit may generate the reference clock of the first frequency which is N times lower than the second frequency of the target clock to supply the generated reference clock to each chip, and the target clock generation unit may multiply the first frequency of the reference clock by N times when the reference clock of the first frequency is input to generate the target clock of the second frequency.

Advantageous Effects

According to an embodiment of the present disclosure, a multi-chip clock synchronization device can reduce input/output operating frequency and power consumption when performing clock synchronization by individually supplying a reference clock of a low frequency to each chip of multiple chips and multiplying the low frequency of the reference clock in each chip by N times to generate and share a target clock.

DETAILED DESCRIPTION OF THE EMBODIMENTS

Figure 1:
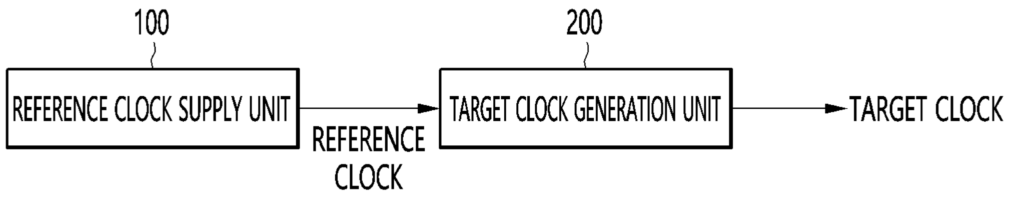
FIGS. 1 to 3 are diagrams for schematically describing a multi-chip clock synchronization device according to the present disclosure.

Hereinafter, the embodiment disclosed in the present specification will be described in detail with reference to the accompanying drawings, but the same or similar components are designated by the same reference numerals regardless of drawing numbers, and repeated description thereof will be omitted. The component suffixes "module" and "part" used in the following description are given or mixed together only considering the ease of creating the specification, and have no meanings or roles that are distinguished from each other by themselves. In addition, in describing the embodiments disclosed in the present specification, when it is determined that detailed descriptions of a related well-known art unnecessarily obscure gist of the embodiments disclosed in the present specification, the detailed description thereof will be omitted. Further, the accompanying drawings are merely for facilitating understanding of the embodiments disclosed in the present specification, the technological scope disclosed in the present specification is not limited by the accompanying drawings, and it should be understood as including all modifications, equivalents and alternatives that fall within the spirit and scope of the present disclosure.

Terms including ordinal numbers, such as first, second, etc., may be used to describe various components, but the components are not limited by the terms. The terms are only used to distinguish one component from another.

It will be understood that when a component is referred to as being "connected" or "coupled" to another component, it may be directly connected or coupled to the other component, but intervening components may be present therebetween. In contrast, it should be understood that when a component is referred to as being "directly connected" or "directly coupled" to another component, there are no other intervening components present.

Figure 2:
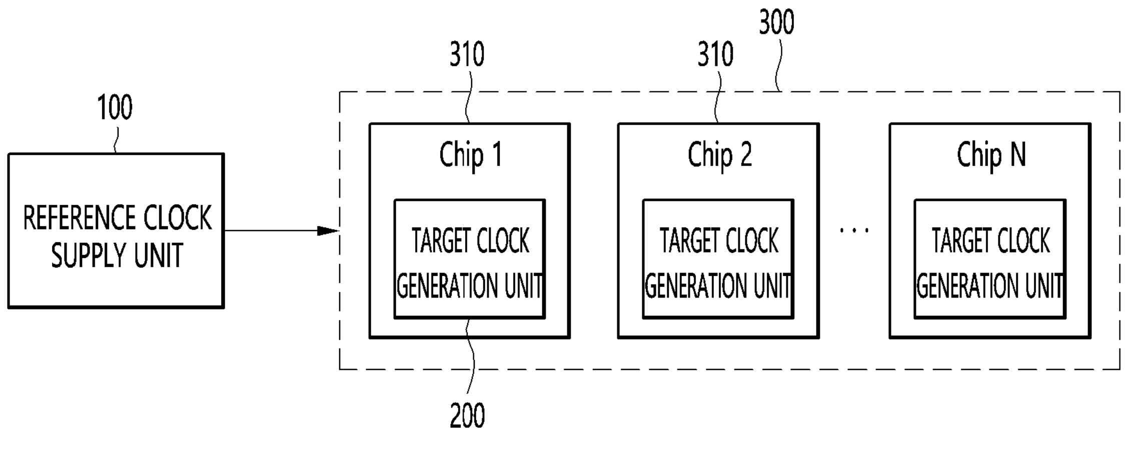
Figure 3:
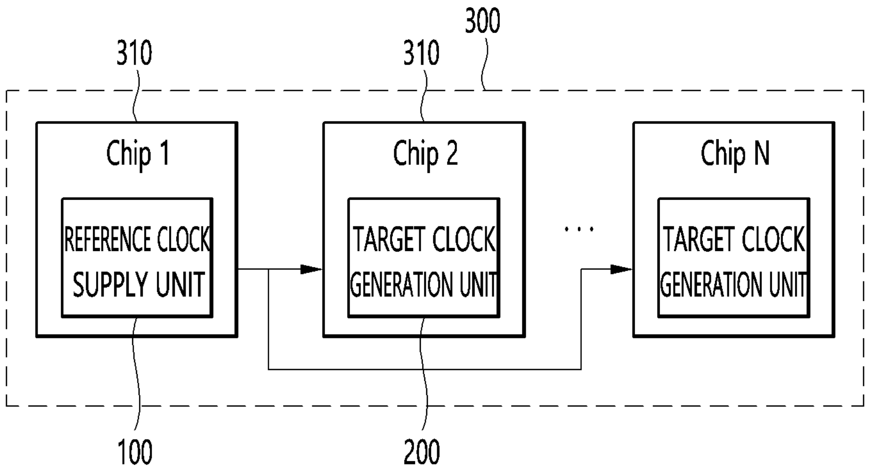

FIGS. 1 to 3 are diagrams for schematically describing a multi-chip clock synchronization device according to the present disclosure.

The multi-chip clock synchronization device of the present disclosure is a device for synchronizing clocks of all chips in a device using a plurality of chips, and may be applied to various devices using a plurality of chips.

As shown in FIGS. 1 to 3, the multi-chip clock synchronization device of the present disclosure may include a reference clock supply unit 100 connected to a plurality of chips and supplying a reference clock of a first frequency to each chip and a target clock generation unit 200 generating a target clock of a second frequency based on the reference clock of the first frequency input to each chip.

Here, the reference clock supply unit 100 may generate the reference clock of the first frequency which is N times lower than the second frequency of the target clock to supply the generated reference clock to each chip, and the target clock generation unit 200 may multiply the first frequency of the reference clock by N times when the reference clock of the first frequency is input to generate the target clock of the second frequency.

As one embodiment, as shown in FIG. 2, the reference clock supply unit 100 may generate the reference clock at outside a plurality of chips 300 to equally supply the reference clock of the first frequency to the plurality of chips 300, and the target clock generation unit 200 may be individually disposed inside each chip 310 to generate the target clock of the second frequency for each chip 310.

Next, the reference clock supply unit 100 may include an oscillation element.

For example, the oscillation element may include an RC oscillator, an LC oscillator, and a crystal oscillator.

In addition, as shown in FIG. 2, the target clock generation unit 200 may be disposed in the same number as a number of the plurality of chips and may be disposed inside each chip 310 to correspond to each chip 310 one-to-one.

In addition, the target clock generation unit 200 may include a phase frequency detector that detects a phase difference between the reference clock and the clock multiplied by N times when the reference clock of the first frequency and the clock multiplied by N times are input, a voltage control oscillator that controls a phase of the clock multiplied by N times based on the phase difference detected by the phase frequency detector to output the target clock of the second frequency, and a clock frequency multiplier that multiplies a frequency of the clock whose phase is controlled by the voltage control oscillator by N times to feed back the clock multiplied by N times to the phase frequency detector.

Here, the target clock generation unit 200 may further include a filter unit that is electrically connected between the phase frequency detector and the voltage control oscillator to remove noise from a clock signal.

In addition, a plurality of target clock generation units 200 may be disposed to correspond to each of the plurality of chips, and the plurality of target clock generation units 200 may multiply the frequency of the target clock by the same multiple to generate the target clock of the same second frequency.

Meanwhile, as another embodiment, as shown in FIG. 3, the reference clock supply unit 100 may generate the reference clock of the first frequency from a master chip among the plurality of chips 300 including one master chip and a plurality of slave chips and equally supply the reference clock of the first frequency to the plurality of slave chips through a clock output terminal of the master chip, and the target clock generation unit 200 may be individually disposed inside the master chip and the slave chip to generate the target clock of the second frequency for each chip 310.

Here, the reference clock supply unit 100 may include a vibrator, a vibrator driver that drives the vibrator to output a vibration frequency, and a clock distribution part that divides the vibration frequency based on a preset division rate to generate the reference clock of the first frequency.

In this case, the vibrator may have one end connected to an input terminal of the master chip and the other end connected to an output terminal of the master chip.

As an example, the vibrator may include a crystal oscillator.

In addition, the reference clock supply unit 100 may be individually disposed inside the master chip and the slave chip, the reference clock supply unit 100 disposed inside the master chip may be turned on to be activated so as to generate the reference clock, and the reference clock supply unit 100 disposed inside each of the plurality of slave chips may be turned off to be inactivated so as not to generate the reference clock.

Here, the reference clock supply unit 100 of the master chip may transmit the reference clock to a clock input terminal of each slave chip through a clock output terminal of the master chip, and the reference clock input to the slave chip may be input to the target clock generation unit 200 disposed inside the slave chip.

In some cases, the reference clock supply unit 100 may be individually disposed inside the master chip and the slave chip, the reference clock supply unit 100 disposed inside the master chip may be turned on to be activated so as to generate the reference clock, and the reference clock supply unit 100 disposed inside each of the plurality of slave chips may be turned off and may buffer the reference clock input from the master chip to supply to the target clock generation unit 200.

Here, the reference clock supply unit 100 of the master chip may transmit the reference clock to an input terminal for connecting the vibrator of each slave chip through the clock output terminal of the master chip, and the reference clock may be input to the vibrator driver for buffering the clock of the reference clock supply unit 100 disposed inside the slave chip.

Next, the plurality of target clock generation units 200 may be disposed to correspond to one master chip and each of the plurality of slave chips, and the plurality of target clock generation units 200 may multiply the frequency of the target clock by the same multiple to generate the target clock of the same second frequency.

As such, in the present disclosure, it is possible to reduce input/output operating frequency and power consumption when performing clock synchronization by individually supplying a reference clock of a low frequency to each chip of multiple chips and multiplying the low frequency of the reference clock in each chip by N times to generate and share a target clock.

Figure 4:
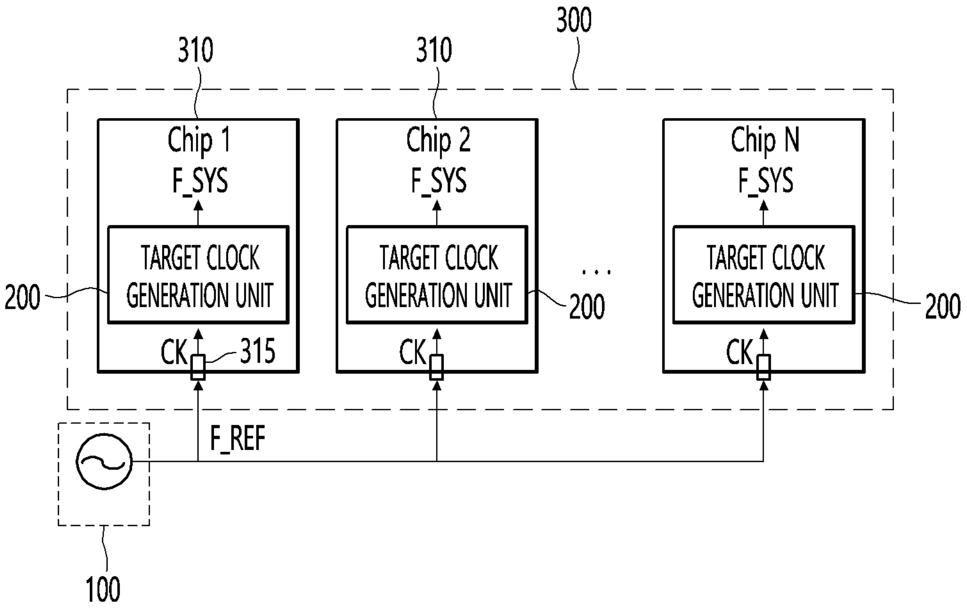
FIG. 4 is a diagram for describing a multi-chip clock synchronization device according to a first embodiment of the present disclosure.

FIG. 4 is a diagram for describing a multi-chip clock synchronization device according to a first embodiment of the present disclosure.

As shown in FIG. 4, the multi-chip clock synchronization device according to the first embodiment of the present disclosure may include a reference clock supply unit 100 supplying a reference clock F_REF of a first frequency to each chip 310 of a plurality of chips 300 and a target clock generation unit 200 generating a target clock F_SYS of a second frequency based on the reference clock of the first frequency input to each chip.

Here, the reference clock supply unit 100 may be disposed outside the plurality of chips 300 and generate the reference clock of the first frequency to equally supply the reference clock of the first frequency to each chip 310 of the plurality of chips 300.

In addition, the target clock generation unit 200 may be individually disposed inside each chip 310 and may generate the target clock of the second frequency based on the reference clock of the first frequency when the reference clock of the first frequency is input for each chip 310.

Here, the reference clock supply unit 100 may include an oscillation element. For example, the oscillation element may include an RC oscillator, an LC oscillator, and a crystal oscillator.

In addition, when generating the reference clock of the first frequency, the reference clock supply unit 100 may determine the first frequency of the reference clock based on at least one condition of a total number of each chip 310 of the plurality of chips 300 and whether jitter generates in the target clock generation unit 200.

For example, the reference clock supply unit 100 may determine the first frequency of the reference clock to be low when the number of the plurality of chips increases.

The reason is that as the number of the plurality of chips increases, a clock transmission speed decreases, and thus power consumption may increase.

Therefore, in the present disclosure, when the number of the plurality of chips increases, the first frequency of the reference clock may be determined to be low, thereby reducing power consumption due to clock transmission.

In addition, the reference clock supply unit 100 may determine a minimum value for the first frequency of the reference clock based on the jitter generation of the target clock generation unit 200.

For example, if jitter generates when the target clock generation unit 200 multiplies the first frequency of the reference clock by N times, the reference clock supply unit 100 may determine the first frequency which is N times lower as the lowest frequency of the reference clock.

The reason is that if the first frequency of the reference clock is too low, the jitter may generate when the target clock generation unit 200 multiplies the first frequency of the reference clock.

Therefore, in the present disclosure, the minimum value for the first frequency of the reference clock may be determined by considering a multiplication frequency at which the jitter generates in the target clock generation unit 200.

As such, the present disclosure may minimize the jitter generation in the target clock generation unit while reducing power consumption due to the clock transmission.

In addition, when supplying the reference clock to the plurality of chips, the reference clock supply unit 100 may simultaneously transmit the same reference clock to the plurality of chips.

In some cases, when supplying the reference clock to the plurality of chips, the reference clock supply unit 100 may transmit the same reference clock to the plurality of chips with a time difference.

As another case, when supplying the reference clock to the plurality of chips, the reference clock supply unit 100 may sequentially transmit the same reference clock to the plurality of chips.

As an example, the reference clock supply unit 100 may sequentially transmit the same reference clock to the plurality of chips based on a preset priority for the plurality of chips.

Next, when supplying the reference clock to the plurality of chips, the reference clock supply unit 100 may supply the reference clock F_REF through a clock input terminal CK 315 of each chip 310.

In addition, the target clock generation unit 200 may be disposed in the same number as the total number of each chip 310 in the plurality of chips 300 and may be disposed inside each chip 310 to correspond to each chip 310 one-to-one.

Next, the target clock generation unit 200 may generate the target clock of the second frequency through equation of F_SYS=F_REF× N (where F_SYS is a target clock frequency of a system, F_REF is the reference clock frequency, and N is a natural number).

Here, the target clock generation unit 200 may change the N value of according to a setting value of pre-stored firmware.

As such, in the first embodiment of the present disclosure, it is possible to generate and share the target clock by supplying a reference clock of a low frequency to the target clock generation unit 200 disposed inside the plurality of chips through the reference clock supply unit 100 disposed outside multiple chips including the plurality of chips and multiplying the low frequency of the reference clock in the target clock generation unit 200 of each chip.

Therefore, in the first embodiment of the present disclosure, the reference clock of the low frequency is transmitted. thereby reducing input/output operating frequency and power consumption.

Figure 5:
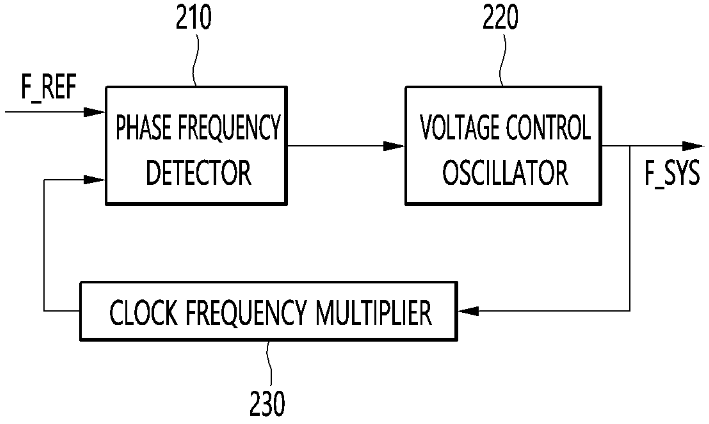
FIG. 5 is a diagram for describing a target clock generation unit in FIG. 4.

FIG. 5 is a diagram for describing the target clock generation unit in FIG. 4.

In the first embodiment of the present disclosure, a plurality of target clock generation units may be disposed to correspond to each chip of the plurality of chips, respectively, and the plurality of target clock generation units may multiply the frequency of the target clock by the same multiple to generate the target clock of the same second frequency.

As shown in FIG. 5, the target clock generation unit may include a phase frequency detector 210, a voltage control oscillator 220, and a clock frequency multiplier 230.

In some cases, the target clock generation unit may further include a filter unit that is electrically connected between the phase frequency detector 210 and the voltage control oscillator 220 to remove noise from a clock signal.

Here, when the reference clock F_REF of the first frequency and the clock multiplied by N times are input, the phase frequency detector 210 may detect a phase difference between the reference clock and the clock multiplied by N times.

In addition, the voltage control oscillator 220 may control a phase of the clock multiplied by N times based on the phase difference detected by the phase frequency detector 210 to output the target clock of the second frequency.

Next, the clock frequency multiplier 230 may multiply a frequency of the clock whose phase is controlled by the voltage control oscillator 220 by N times to feed back the clock multiplied by N times to the phase frequency detector 210.

Here, the clock frequency multiplier 230 may generate the target clock of the second frequency through equation of F_SYS=F_REF× N (where F_SYS is a target clock frequency of a system, F_REF is the reference clock frequency, and N is a natural number).

In this case, if the N value is changed according to a setting value of pre-stored firmware when multiplying the frequency of the target clock by N times, the clock frequency multiplier 230 may multiply the frequency of the target clock based on the changed N value.

In addition, the target clock generation unit of the present disclosure may modify various circuit design based on a phase locked loop (PLL) circuit.

Figure 6:
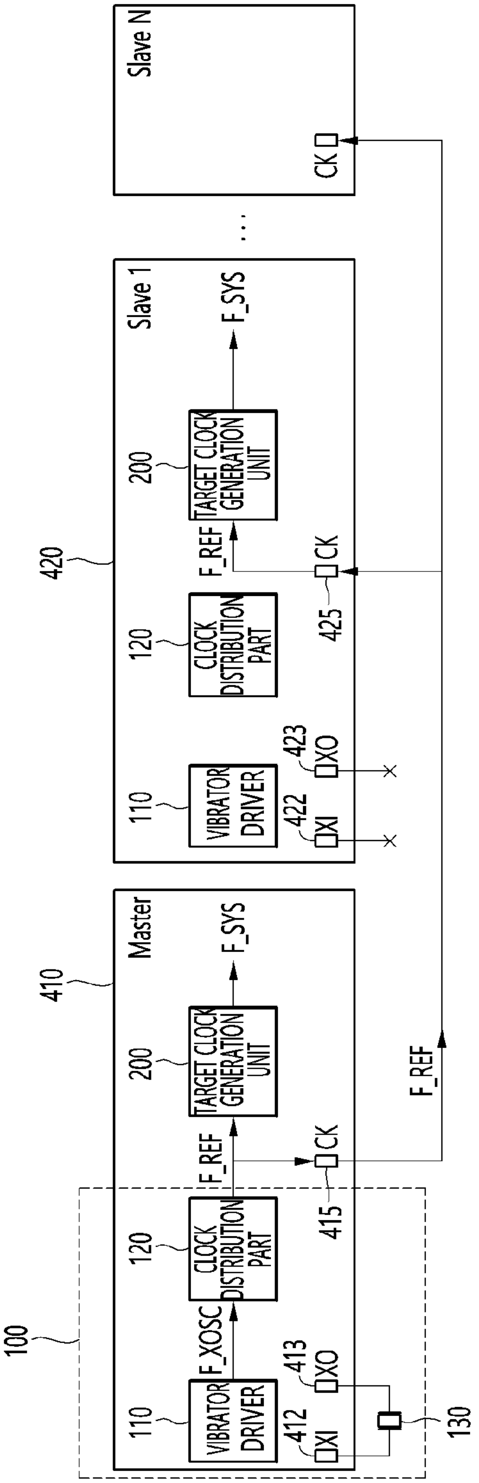
FIG. 6 is a diagram for describing a multi-chip clock synchronization device according to a second embodiment of the present disclosure.

FIG. 6 is a diagram for describing a multi-chip clock synchronization device according to a second embodiment of the present disclosure.

As shown in FIG. 6, the multi-chip clock synchronization device according to the second embodiment of the present disclosure may include a clock supply unit 100 supplying a reference clock F_REF of a first frequency to a master chip 410 and a plurality of slave chips 420 and a target clock generation unit 200 generating a target clock F_SYS of a second frequency based on the reference clock of the first frequency.

Here, the reference clock supply unit 100 may be disposed on the master chip 410 of multiple chips including one master chip 410 and a plurality of slave chips 420 and generate the reference clock F-REF of the first frequency to equally supply the reference clock of the first frequency to the target clock generation unit 200 of the master chip 410 and the target clock generation unit 200 of each slave chip 420.

In addition, the target clock generation unit 200 may be individually disposed inside the master chip 410 and the slave chip 420 and may generate the target clock based on the reference clock of the first frequency when the reference clock of the first frequency is input from the master chip 410.

Here, the reference clock supply unit 100 may include a vibrator 130, a vibrator driver 110 driving the vibrator 130 to output a vibration frequency, and a clock distribution part 120 dividing the vibration frequency based on a preset division rate to generate the reference clock of the first frequency.

In this case, the vibrator 130 may have one end connected to an input terminal XI 412 of the master chip 410 and the other end connected to an output terminal XO 413 of the master chip 410.

As an example, the vibrator 130 may include a crystal oscillator.

In addition, the clock distribution part 120 may generate the reference clock of the first frequency through equation of F_REF=F_XOCS/R (where F_REF is the reference clock frequency, F_XOCS is the vibration frequency, and R is the division rate).

Here, the reference clock supply unit 100 may change the R value according to a setting value of pre-stored firmware.

In addition, the reference clock supply unit 100 may be individually disposed inside the master chip 410 and the slave chip 420, the reference clock supply unit 100 disposed inside the master chip 410 may be turned on to be activated so as to generate the reference clock, and the reference clock supply unit 100 disposed inside each of the plurality of slave chips 420 may be turned off to be inactivated so as not to generate the reference clock.

Here, the reference clock supply unit 100 of the master chip 410 may transmit the reference clock to a clock input terminal CK 425 of each slave chip 420 through a clock output terminal CK 415 of the master chip 410, and the reference clock input to the slave chip 420 may be input to the target clock generation unit 200 disposed inside the slave chip 420.

In this case, the reference clock supply unit 100 disposed inside each slave chip 420 is turned off to be inactivated, and thus an input terminal XI 422 and an output terminal XO 423 of the slave chip 420 for connecting the vibrator may be opened so as to block electrical connection with an external element.

In addition, when generating a reference clock of the first frequency, the reference clock supply unit 100 may determine the first frequency of the reference clock based on at least one condition of a total number of the plurality of slave chips 420 and whether jitter generates in the target clock generation unit 200.

For example, the reference clock supply unit 100 may determine the first frequency of the reference clock to be low when the number of the plurality of slave chips 420 increases.

The reason is that as the number of the plurality of slave chips increases, a clock transmission speed decreases, and thus power consumption may increase.

Therefore, in the present disclosure, when the number of the plurality of slave chips increases, the first frequency of the reference clock may be determined to be low, thereby reducing power consumption due to clock transmission.

In addition, the reference clock supply unit 100 may determine a minimum value for the first frequency of the reference clock based on the jitter generation of the target clock generation unit 200.

For example, if jitter generates when the target clock generation unit 200 multiplies the first frequency of the reference clock by N times, the reference clock supply unit 100 may determine the first frequency which is N times lower as the lowest frequency of the reference clock.

The reason is that if the first frequency of the reference clock is too low, the jitter may generate when the target clock generation unit 200 multiplies the first frequency of the reference clock.

Therefore, in the present disclosure, the minimum value for the first frequency of the reference clock may be determined by considering a multiplication frequency at which the jitter generates in the target clock generation unit 200.

As such, the present disclosure may minimize the jitter generation in the target clock generation unit while reducing power consumption due to the clock transmission.

In addition, when supplying the reference clock to the plurality of slave chips 420, the reference clock supply unit 100 of the master chip 410 may simultaneously transmit the same reference clock to the plurality of slave chips 420.

In some cases, when supplying the reference clock to the plurality of slave chips 420, the reference clock supply unit 100 of the master chip 410 may transmit the same reference clock to the plurality of slave chips 420 with a time difference.

As another case, when supplying the reference clock to the plurality of slave chips 420, the reference clock supply unit 100 of the master chip 410 may sequentially transmit the same reference clock to the plurality of slave chips 420.

As an example, the reference clock supply unit 100 of the master chip 410 may sequentially transmit the same reference clock to the plurality of slave chips 420 based on a preset priority for the plurality of slave chips 420.

Next, when supplying the reference clock to the plurality of slave chips 420, the reference clock supply unit 100 of the master chip 410 may supply the reference clock F_REF through the clock input terminal CK 425 of each slave chip 420.

In addition, the target clock generation unit 200 may be disposed in the same number as the total number of one master chip 410 and the plurality of slave chips 420 and may be disposed inside each chip to correspond to each chip one-to-one.

Next, the target clock generation unit 200 may generate the target clock of the second frequency through equation of $F\_SYS=F\_REF \times N$ (where F_SYS is a target clock frequency of a system, F_REF is a reference clock frequency, and N is a natural number).

Here, the target clock generation unit 200 may change the N value according to a setting value of pre-stored firmware.

As such, in the second embodiment of the present disclosure, it is possible to generate and share the target clock by supplying a reference clock of a low frequency to the target clock generation unit 200 disposed inside each of the master chip 410 and the plurality of slave chips 420 through the reference clock supply unit 100 disposed inside the master chip 410 and multiplying the low frequency of the reference clock in the target clock generation unit 200 of each chip.

Therefore, in the second embodiment of the present disclosure, the reference clock of the low frequency is transmitted, thereby reducing input/output operating frequency and power consumption, and the vibrator of an active element is used inside the master chip 410 without using an external passive element, thereby reducing design costs.

Figure 7:
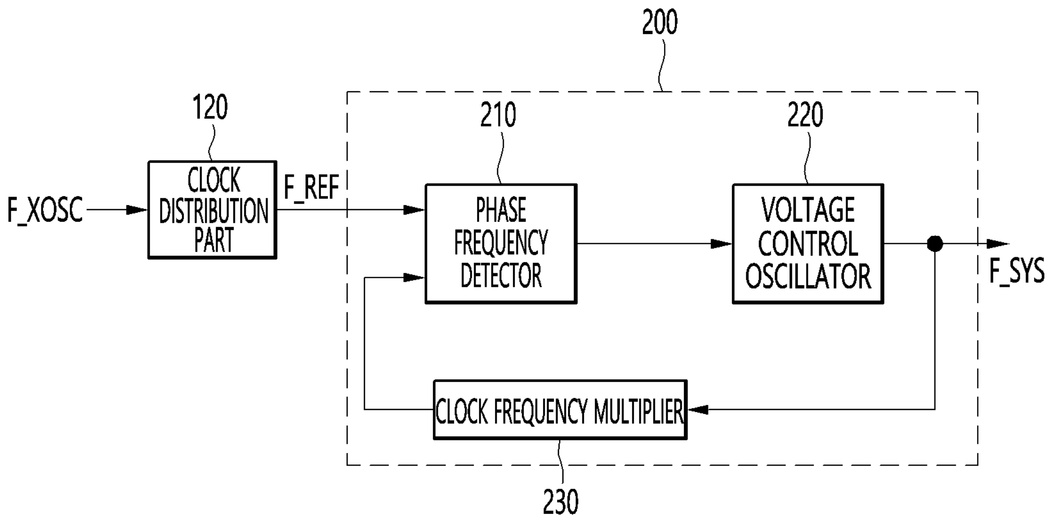
FIG. 7 is a diagram for describing a target clock generation unit in FIG. 6.

FIG. 7 is a diagram for describing the target clock generation unit in FIG. 6.

In the second embodiment of the present disclosure, a plurality of target clock generation units 200 may be disposed to correspond to one master chip and the plurality of slave chips, respectively, and the plurality of target clock generation units 200 may multiply the frequency of the target clock by the same multiple to generate the target clock of the same second frequency.

As shown in FIG. 7, the target clock generation unit 200 may include a phase frequency detector 210, a voltage control oscillator 220, and a clock frequency multiplier 230.

In some cases, the target clock generation unit 200 may further include a filter unit that is electrically connected between the phase frequency detector 210 and the voltage control oscillator 220 to remove noise from a clock signal.

Here, when the reference clock F_REF of the first frequency and the clock multiplied by N times are input, the phase frequency detector 210 may detect a phase difference between the reference clock and the clock multiplied by N times.

Here, the reference clock F_REF of the first frequency may be input through the clock distribution part 120 that divides a vibration frequency F_OSC based on a preset division rate to generate the reference clock of the first frequency.

The clock distribution part 120 may generate the reference clock of the first frequency through equation of $F\_REF=F\_XOCS/R$ (where F_REF is the reference clock frequency, F_XOCS is the vibration frequency, and R is the division rate).

In this case, when the R value is changed according to the setting value of pre-stored firmware, the clock distribution part 120 may divide the vibration frequency F_OSC based on the changed R value.

In addition, the voltage control oscillator 220 may control a phase of the clock multiplied by N times based on the phase difference detected by the phase frequency detector 210 to output the target clock of the second frequency.

Next, the clock frequency multiplier 230 may multiply a frequency of the clock whose phase is controlled by the voltage control oscillator 220 by N times to feed back the clock multiplied by N times to the phase frequency detector 210.

Here, the clock frequency multiplier 230 may generate the target clock of the second frequency through equation of F_SYS=F_REF×N (where F_SYS is a target clock frequency of a system, F_REF is the reference clock frequency, and N is a natural number).

In this case, when the N value is changed according to the setting value of pre-stored firmware when multiplying the frequency of the target clock by N times, the clock frequency multiplier 230 may multiply the frequency of the target clock based on the changed N value.

In addition, the target clock generation unit of the present disclosure may modify various circuit design based on the phase locked loop (PLL) circuit.

Figure 8:
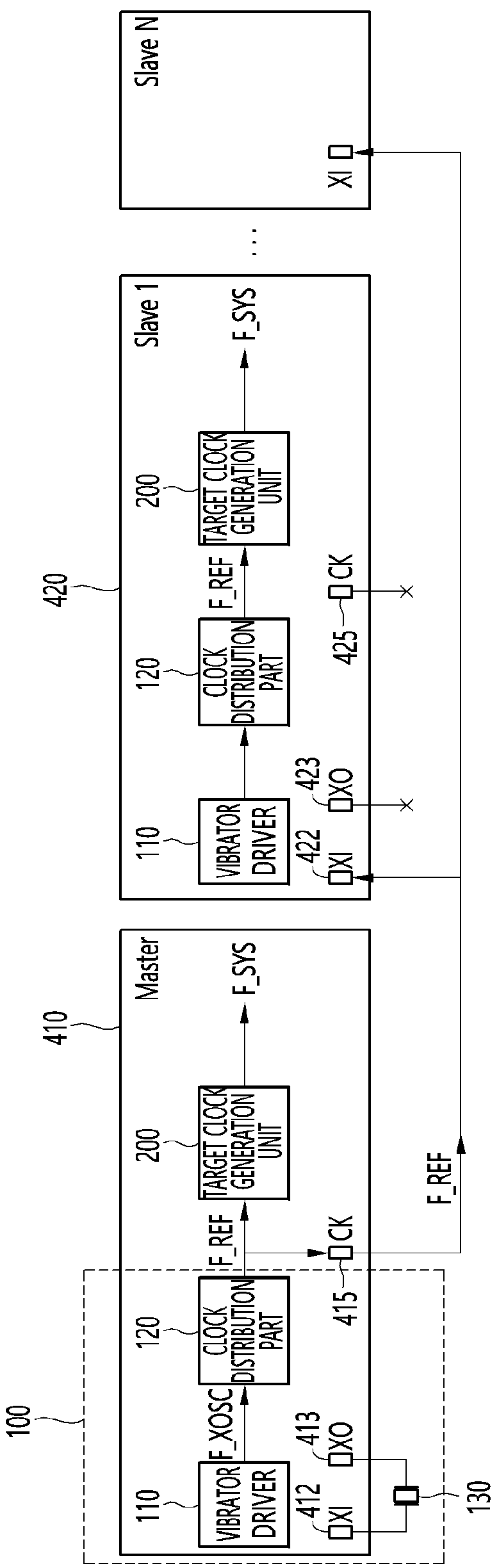
FIG. 8 is a diagram for describing a multi-chip clock synchronization device according to a third embodiment of the present disclosure.

FIG. 8 is a diagram for describing a multi-chip clock synchronization device according to a third embodiment of the present disclosure.

As shown in FIG. 8, the multi-chip clock synchronization device according to the third embodiment of the present disclosure may include a clock supply unit 100 supplying a reference clock F_REF of a first frequency to a master chip 410 and a plurality of slave chips 420 and a target clock generation unit 200 generating a target clock F_SYS of a second frequency based on the reference clock of the first frequency.

Here, the reference clock supply unit 100 may be disposed on the master chip 410 of multiple chips including one master chip 410 and a plurality of slave chips 420 and generate the reference clock F-REF of the first frequency to equally supply the reference clock of the first frequency to the target clock generation unit 200 of the master chip 410 and the target clock generation unit 200 of each slave chip 420.

In addition, the target clock generation unit 200 may be individually disposed inside the master chip 410 and the slave chip 420 and may generate the target clock based on the reference clock of the first frequency when the reference clock of the first frequency is input from the master chip 410.

Here, the reference clock supply unit 100 may include a vibrator 130, a vibrator driver 110 driving the vibrator 130 to output a vibration frequency, and a clock distribution part 120 dividing the vibration frequency based on a preset division rate to generate the reference clock of the first frequency.

In this case, the vibrator 130 may have one end connected to an input terminal 412 of the master chip 410, and the other end connected to an output terminal 413 of the master chip 410.

As an example, the vibrator 130 may include a crystal oscillator.

In addition, the clock distribution part 120 may generate the reference clock of the first frequency through equation of F_REF=F_XOCS/R (where F_REF is the reference clock frequency, F_XOCS is the vibration frequency, and R is the division rate).

Here, the reference clock supply unit 100 may change the R value according to a setting value of pre-stored firmware.

In addition, the reference clock supply unit 100 may be individually disposed inside the master chip 410 and the slave chip 420, the reference clock supply unit 100 disposed inside the master chip 410 may be turned on to be activated so as to generate the reference clock, and the reference clock supply unit 100 disposed inside each of the plurality of slave chips 420 may be turned off and may buffer the reference clock input from the master chip 410 to supply to the target clock generation unit 200.

Here, the reference clock supply unit 100 of the master chip 410 may transmit the reference clock to an input terminal XI 422 for connecting the vibrator of each slave chip 420 through a clock output terminal CK 415 of the master chip 410, and the reference clock may be input to the vibrator driver 110 for buffering the clock of the reference clock supply unit 100 disposed inside the slave chip 420.

In this case, each slave chip 420 may be electrically connected only to the input terminal XI 422 for connecting the vibrator for inputting the reference clock from the master chip 410, and an output terminal XO 423 for connecting the vibrator may be opened so as to block electrical connection with an external element.

In the third embodiment of the present disclosure, each slave chip 420 may reduce noise of the reference clock by receiving the reference clock to the input terminal XI 422 for connecting the vibrator and buffering the reference clock through the vibrator driver 110 for buffering the clock.

As such, in the third embodiment of the present disclosure, except for a feature of receiving the reference clock to the input terminal XI 422 for connecting the vibrator and buffering the reference clock through the vibrator driver 110 for buffering the clock in each slave chip 420, the remaining components and operations are the same as those of the second embodiment of the present disclosure, and thus a detailed description will be omitted.

As such, in the third embodiment of the present disclosure, it is possible to generate and share the target clock by supplying a reference clock of a low frequency to the target clock generation unit 200 via the vibrator driver 110 and the clock distribution part 120 disposed inside each of the master chip 410 and the plurality of slave chips 420 through the reference clock supply unit 100 disposed inside the master chip 410 and multiplying the low frequency of the reference clock in the target clock generation unit 200 of each chip.

Therefore, in the third embodiment of the present disclosure, the reference clock of the low frequency is transmitted, thereby reducing input/output operating frequency and power consumption, and the vibrator of an active element is used inside the master chip 410 without using an external passive element, thereby reducing design costs and reducing noise of the target clock through buffering of the reference clock.

Figure 9:
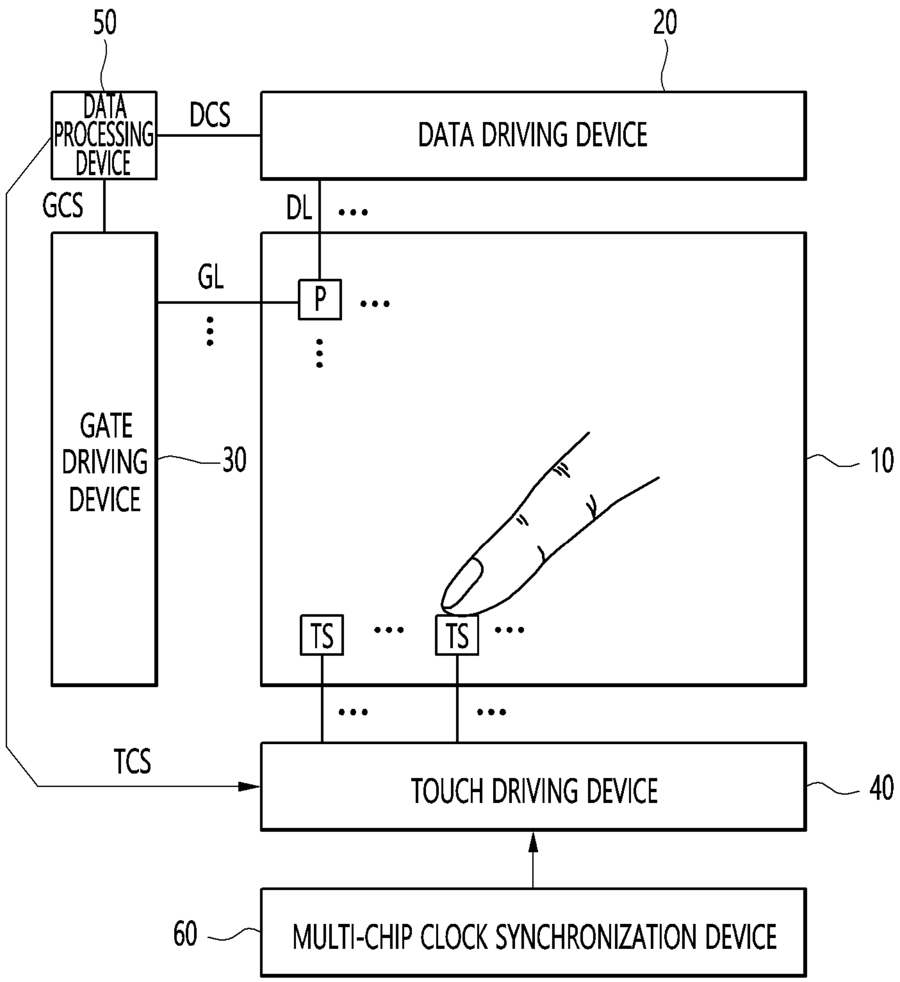
FIGS. 9 and 10 are diagrams for describing a display device including a multi-chip clock synchronization device according to the present disclosure.
Figure 10:
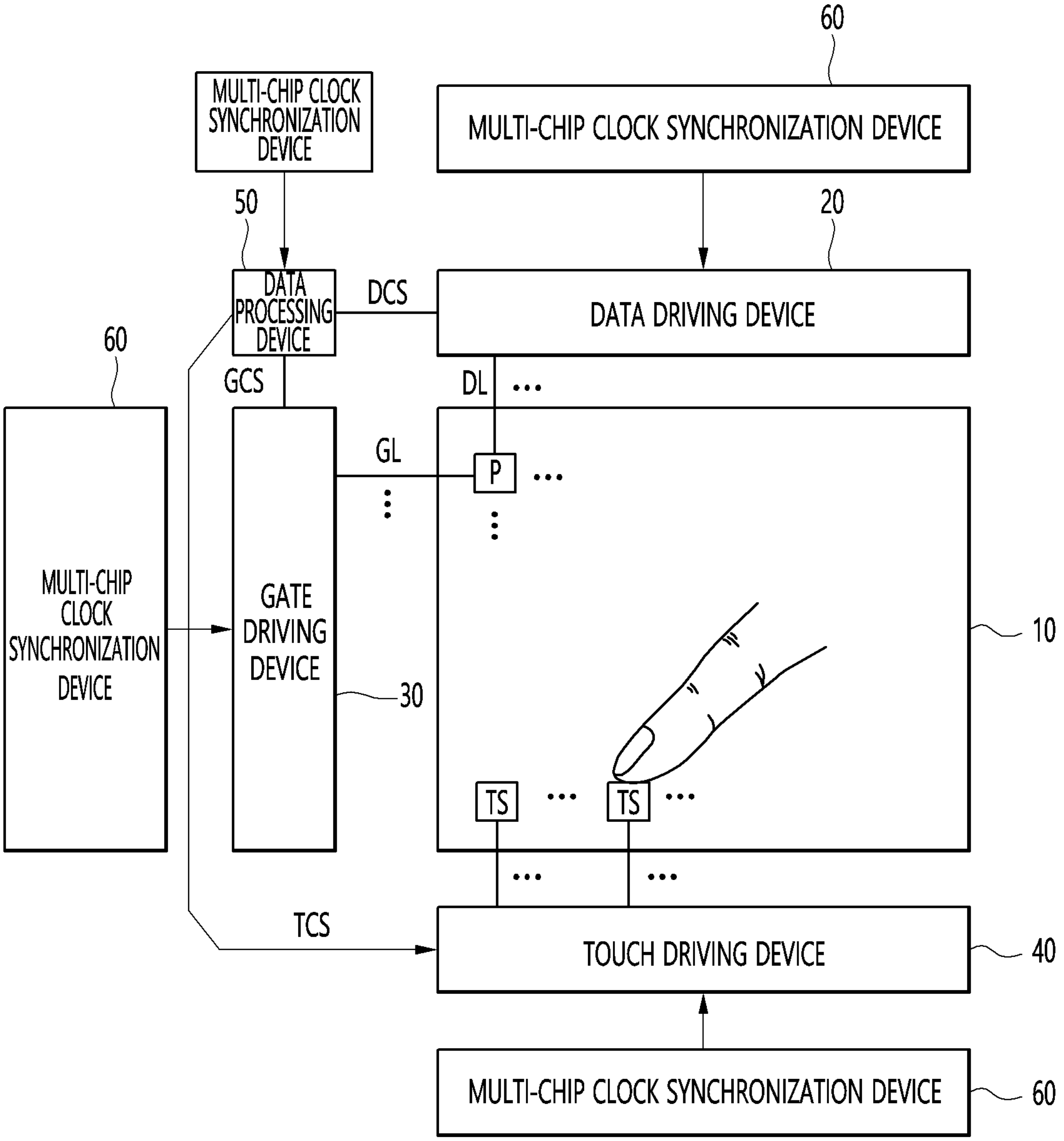

FIGS. 9 and 10 are diagrams for describing a display device including the multi-chip clock synchronization device according to the present disclosure.

As shown in FIGS. 9 and 10, the display device may include a panel 10, a data driving device 20, a gate driving device 30, a touch driving device 40, a data processing device 50, a multi-chip clock synchronization device 60, and the like.

Here, at least one device of the data driving device 20, the gate driving device 30, the touch driving device 40, the data processing device 50, and the multi-chip clock synchronization device 60 may be included in another device.

For example, the data driving device 20 may be included in the touch driving device 40, and the gate driving device 30 may be included in the data driving device 20.

As another case, only some configurations of one driving device may be included in another driving device.

As an example, in the multi-chip clock synchronization device 60, some configurations such as a reference clock supply unit and a target clock generation unit may be included in at least one device of the data driving device 20, the gate driving device 30, the touch driving device 40, and the data processing device 50.

In addition, the data driving device 20 may drive a data line DL connected to a pixel P, the gate driving device 30 may drive a gate line GL connected to the pixel P, and the touch driving device 40 may drive a touch sensor TS disposed on the panel 10.

The data driving device 120 may supply a data voltage to the data line DL in order to display an image in each pixel P of the panel 10.

In addition, the data driving device 20 may receive image data and a data control signal (DCS) from the data processing device 50 and generate the data voltage according to a grayscale value of each pixel indicated by the image data to drive each pixel.

Next, the gate driving device 130 may supply a scan signal to the gate line GL in order to turn on and off a transistor positioned in each pixel P.

In addition, the gate driving device 30 may receive a gate control signal (GCS) including a plurality of clock signals from the data processing device 50, generate a scan signal using the clock signal, and supply the scan signal to the gate line (GL).

Next, the panel 10 may include a display panel 112 and further include a touch screen panel (TSP) 111.

Here, the display panel 112 and the touch screen panel 111 may share some components with each other.

A plurality of touch sensors (TS) may be disposed on the panel 10, and the touch driving device 40 may drive the touch sensors (TS) using a touch driving signal.

Next, the data processing device 50 may control a timing of each of driving devices 20, 30, and 40 through control signals GCS, DCS, and TCS.

In addition, the touch driving device 40 may generate a sensing value for the touch sensor (TS) according to a response signal formed in the touch sensor (TS) in response to the touch driving signal and calculate a touch coordinate of an object using a sensing value for the plurality of touch sensors (TS), and the calculated touch coordinate may be transmitted to another device such as a host to utilize.

Next, as shown in FIG. 9, the multi-chip clock synchronization device 60 may apply a target clock to multiple chips of the touch driving device 40 to synchronize clocks of the multiple chips.

Here, the multi-chip clock synchronization device may include a reference clock supply unit connected to a plurality of chips and supplying a reference clock of a first frequency to each chip and a target clock generation unit generating a target clock of a second frequency based on the reference clock of the first frequency input to each chip.

In this case, the reference clock supply unit may generate the reference clock of the first frequency which is N times lower than the second frequency of the target clock to supply the generated reference clock to each chip, and the target clock generation unit may multiply the first frequency of the reference clock by N times when the reference clock of the first frequency is input to generate the target clock of the second frequency.

In the multi-chip clock synchronization device 60, the reference clock supply unit may generate the reference clock at outside the plurality of chips to equally supply the reference clock of the first frequency to the plurality of chips, and the clock generation unit may be individually disposed inside each chip to generate the target clock of the second frequency for each chip.

In some cases, in the multi-chip clock synchronization device 60, the reference clock supply unit may generate the reference clock of the first frequency from a master chip among the plurality of chips including one master chip and a plurality of slave chips and equally supply the reference clock of the first frequency to the plurality of slave chips through a clock output terminal of the master chip, and the target clock generation unit may be individually disposed inside the master chip and the slave chip to generate the target clock of the second frequency for each chip.

In addition, as shown in FIG. 10, the multi-chip clock synchronization device 60 may apply a target clock to a device including multiple chips such as the data driving device 20, the gate driving device 30, the touch driving device 40, and the data processing device 50 to synchronize the clocks of the multiple chips.

Here, the multi-chip clock synchronization device 60 may be individually disposed in each driving device, generate and supply the target clock required by each driving device, and synchronize the clocks of the multiple chips included in each driving device.

As such, the multi-chip clock synchronization device 60 of the present disclosure may reduce input/output operating frequency and power consumption when performing clock synchronization of each driving device by individually supplying a reference clock of a low frequency to each chip of multiple chips and multiplying the low frequency of the reference clock in each chip by N times to generate and share the target clock.

Figure 11:
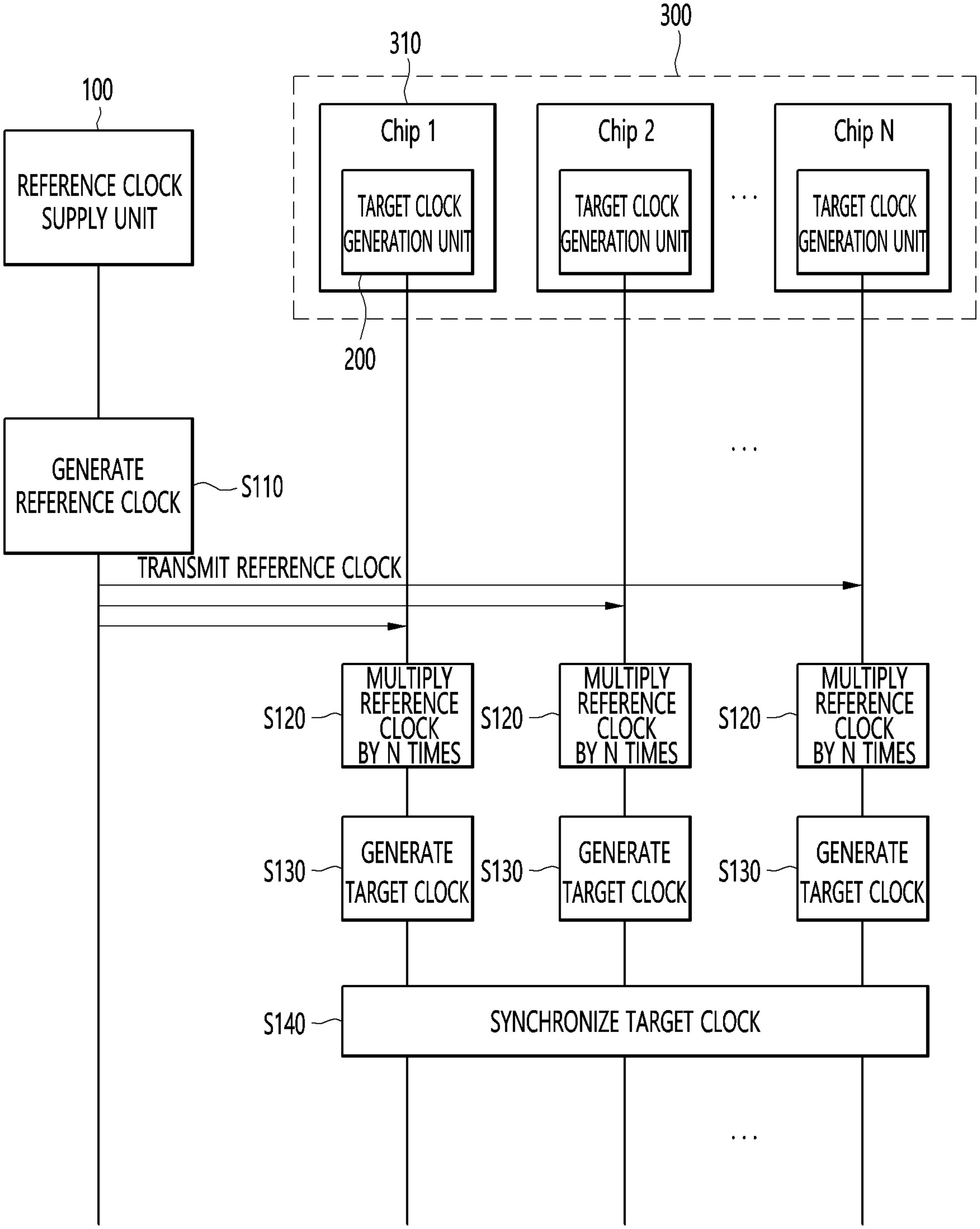
FIGS. 11 to 13 are flowcharts for describing a multi-chip clock synchronization method according to the present disclosure.
Figure 12:
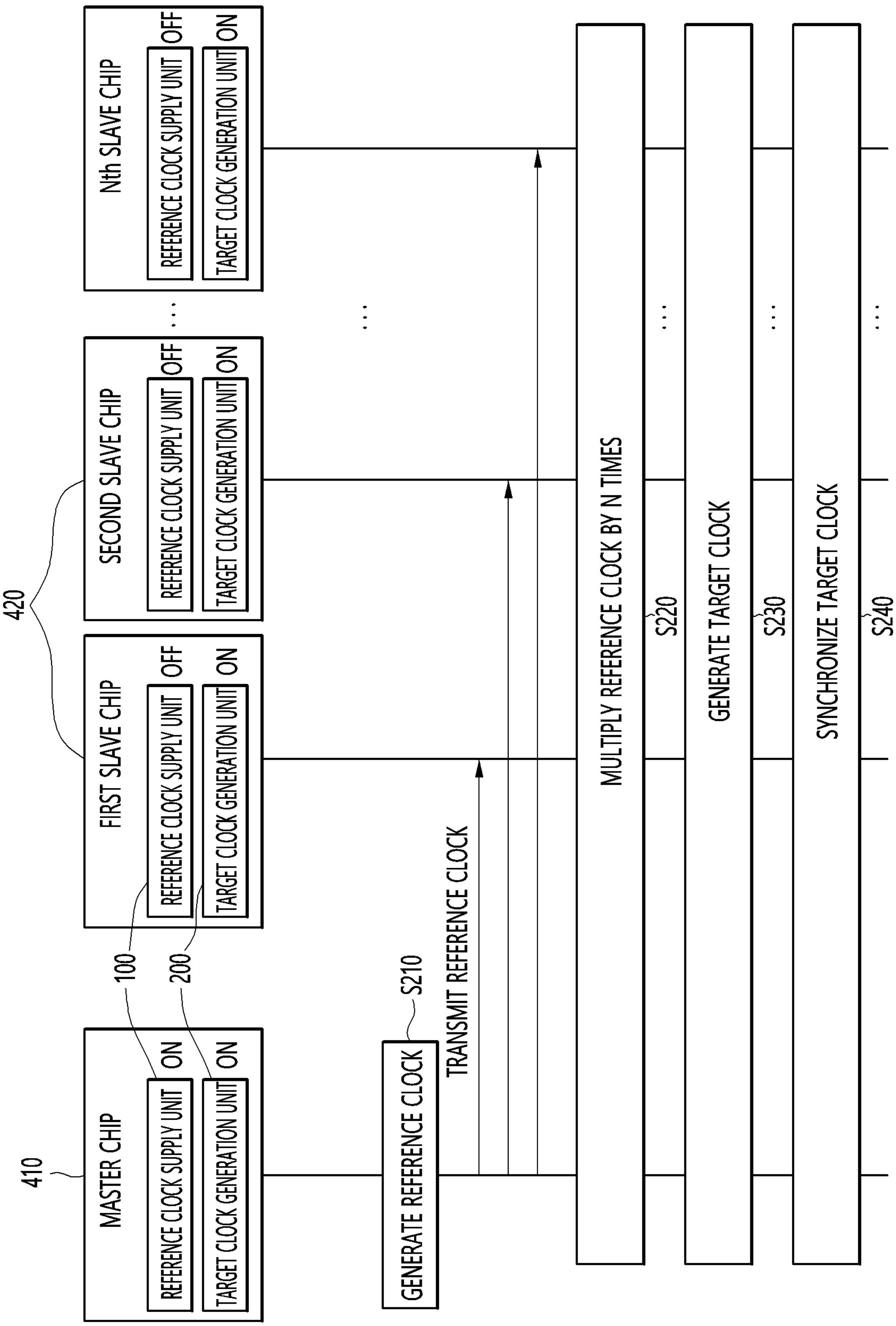
Figure 13:
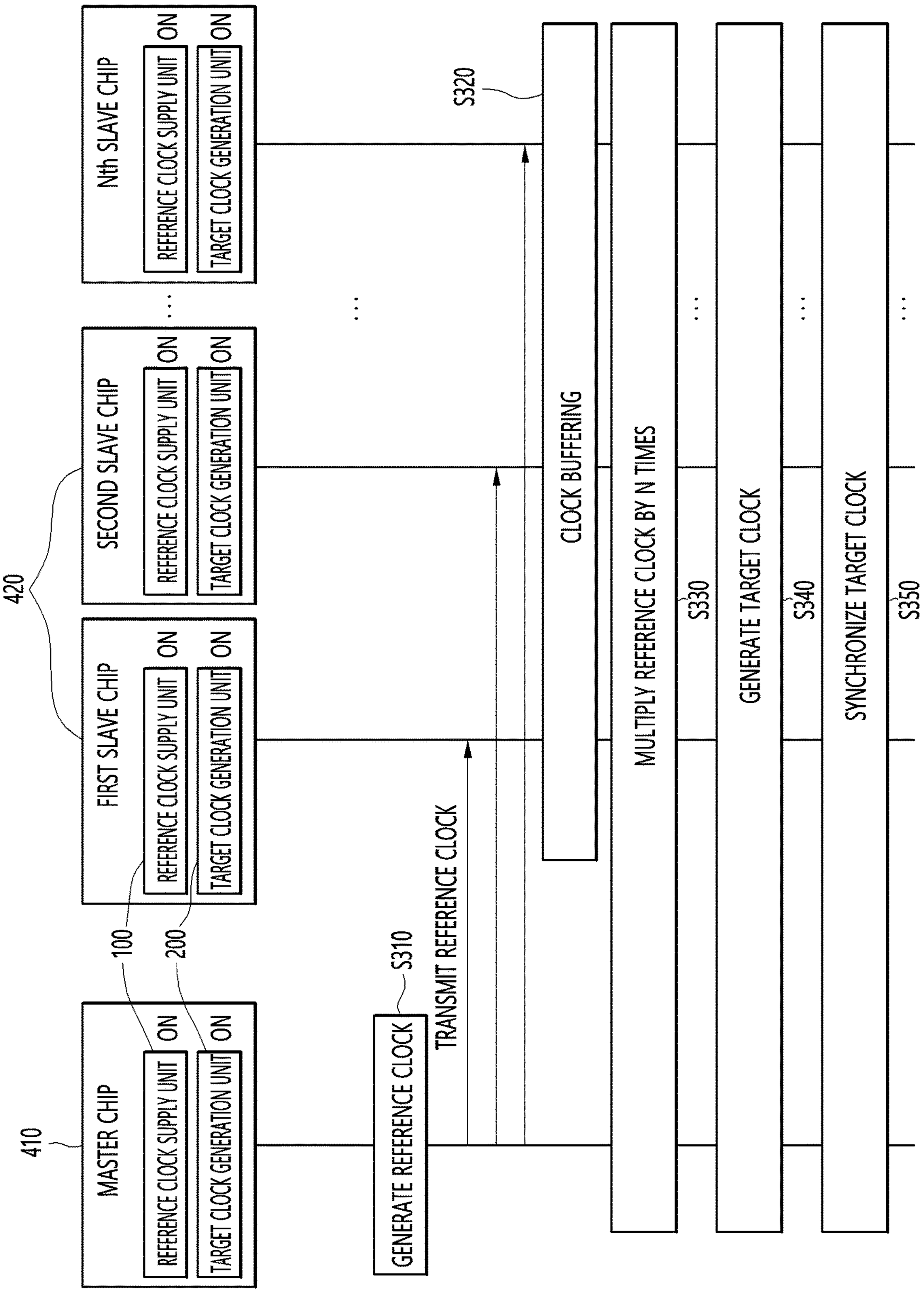

FIGS. 11 to 13 are flowcharts for describing a multi-chip clock synchronization method according to the present disclosure.

FIG. 11 is a clock synchronization method of the multi-chip clock synchronization device according to the first embodiment of the present disclosure, where the reference clock supply unit 100 may be disposed outside the plurality of chips 300, and the target clock generation unit 200 may be individually disposed inside each chip 310.

As shown in FIG. 11, the reference clock supply unit 100 may generate the reference clock of the first frequency which is N times lower than the second frequency of the target clock (S110).

Next, the reference clock supply unit 100 may supply the generated reference clock of the first frequency to each chip 310 of the plurality of chips 300.

Next, when the reference clock of the first frequency is input to each chip 310, the target clock generation unit 200 may multiply the first frequency of the reference clock by N times in each chip (S120) to generate the target clock of the second frequency (S130).

Next, in the target clock generation unit 200, all of the plurality of chips 300 may be synchronized to the target clock of the same frequency by supplying the generated target clock of the second frequency to each chip (S140).

FIG. 12 is a clock synchronization method of the multi-chip clock synchronization device according to the second embodiment of the present disclosure, where the reference clock supply unit 100 and the target clock generation unit 200 may be disposed inside the master chip 410 and the plurality of slave chips 420, respectively.

Here, the reference clock supply unit 100 disposed inside the master chip 410 may be turned on to be activated so as to generate the reference clock, and the reference clock supply unit 100 disposed inside each of the plurality of slave chips 420 may be turned off to be inactivated so as not to generate the reference clock.

In addition, the target clock generation unit 200 disposed inside the master chip 410 may be turned on to be activated so as to generate the target clock, and the target clock generation unit 200 disposed inside each of the plurality of slave chips 420 may be turned on to be activated so as to generate the target clock.

As shown in FIG. 12, in the second embodiment of the present disclosure, the reference clock supply unit 100 of the master chip 410 may generate the reference clock of the first frequency which is N times lower than the second frequency of the target clock (S210).

Here, when driving the vibrator to output the vibration frequency, the reference clock supply unit 100 of the master chip 410 may divide the vibration frequency based on the preset division rate to generate the reference clock of the first frequency.

Next, the reference clock supply unit 100 of the master chip 410 may supply the generated reference clock of the first frequency to each of the plurality of slave chips 420.

Here, the reference clock supply unit 100 of the master chip 410 may transmit the reference clock to the clock input terminal of each slave chip 420 through the clock output terminal of the master chip 410, and the reference clock input to the slave chip 420 may be input to the target clock generation unit 200 disposed inside the slave chip 420.

Next, when the reference clock of the first frequency is input, the target clock generation unit 200 of the master chip 410 and the target clock generation unit 200 of each slave chip 420 may multiply the first frequency of the reference clock by N times (S220) to generate the target clock of the second frequency (S230).

Next, in the target clock generation unit 200, all of one master chip 410 and the plurality of chips 420 may be synchronized to the target clock of the same frequency by supplying the generated target clock of the second frequency to each of the master chip 410 and the plurality of slave chips 420 (S240).

FIG. 13 is a clock synchronization method of the multi-chip clock synchronization device according to the third embodiment of the present disclosure, where the reference clock supply unit 100 and the target clock generation unit 200 may be disposed inside the master chip 410 and the plurality of slave chips 420, respectively.

Here, the reference clock supply unit 100 disposed inside the master chip 410 may be turned on to be activated so as to generate the reference clock, and the reference clock supply unit 100 disposed inside each of the plurality of slave chips 420 may be turned off and may buffer the reference clock input from the master chip 410 to supply to the target clock generation unit 200.

Here, the reference clock supply unit 100 of the master chip 410 may transmit the reference clock to the input terminal for connecting the vibrator of each slave chip 420 through the clock output terminal of the master chip 410, and the reference clock may be input to the vibrator driver for buffering the clock of the reference clock supply unit 100 disposed inside the slave chip 420.

In addition, the target clock generation unit 200 disposed inside the master chip 410 may be turned on to be activated so as to generates the target clock, and the target clock generation unit 200 disposed inside each of the plurality of slave chips 420 may also be turned on to be activated so as to generate the target clock.

As shown in FIG. 13, in the third embodiment of the present disclosure, the reference clock supply unit 100 of the master chip 410 may generate the reference clock of the first frequency which is N times lower than the second frequency of the target clock (S310).

Here, when driving the vibrator to output the vibration frequency, the reference clock supply unit 100 of the master chip 410 may divide the vibration frequency based on a preset division rate to generate the reference clock of the first frequency.

Next, the reference clock supply unit 100 of the master chip 410 may supply the generated reference clock of the first frequency to each of the plurality of slave chips 420.

Here, the reference clock supply unit 100 of the master chip 410 may transmit the reference clock to the input terminal for connecting the vibrator of each slave chip 420 through the clock output terminal of the master chip 410, and the reference clock may be input to the vibrator driver 110 for buffering the clock of the reference clock supply unit 100 disposed inside the slave chip 420.

Next, each slave chip 420 may reduce noise of the reference clock by receiving the reference clock to the input terminal for connecting the vibrator and buffering the reference clock through the vibrator driver for buffering the clock (S320).

In addition, the buffered reference clock may be input to the target clock generation unit 200 disposed inside the slave chip 420.

Next, when the reference clock of the first frequency is input, the target clock generation unit 200 of the master chip 410 and the target clock generation unit 200 of each slave chip 420 may multiply the first frequency of the reference clock by N times (S330) to generate the target clock of the second frequency (S340).

Next, in the target clock generation unit 200, all of one master chip 410 and the plurality of chips 420 may be synchronized to the target clock of the same frequency by supplying the generated target clock of the second frequency to each of the master chip 410 and the plurality of slave chips 420 (S350).

As such, in the present disclosure, it is possible to reduce input/output operating frequency and power consumption when performing clock synchronization by individually supplying a reference clock of a low frequency to each chip of multiple chips and multiplying the low frequency of the reference clock in each chip by N times to generate and share a target clock.

The present disclosure described above may be implemented as computer-readable code on a program-recorded medium. A computer-readable media includes all types of recording devices in which data may be read by a computer system is stored. As an example of the computer-readable media, there are a hard disk drive (HDD), a solid-state disk (SSD), a silicon disk drive (SDD), ROM, RAM, CD-ROM, magnetic tape, floppy disk, optical data storage device, and the like. In addition, the computer may include a processor of an artificial intelligence device.

What is claimed is:

1. A multi-chip clock synchronization device comprising:

a reference clock supply unit connected to a plurality of chips and configured to supply a reference clock having a first frequency to each of the plurality of chips; and a target clock generation unit configured to generate a target clock having a second frequency based on the reference clock of the first frequency, wherein the reference clock supply unit is configured to generate the reference clock having the first frequency which is N times lower than the second frequency of the target clock to supply the generated reference clock to the each of the plurality of chips, the target clock generation unit is configured to multiply the first frequency of the reference clock by N times when the reference clock of the first frequency is inputted to generate the target clock having the second frequency, the reference clock supply unit is configured to determine the first frequency as a lowest frequency of the reference clock if a jitter is generated when the target clock generation unit multiplies the first frequency of the reference clock by N times, and the reference clock supply unit is further configured to determine the first frequency of the reference clock to be low when a total number of the plurality of chips increases, thereby reducing power consumption due to clock transmission.

2. The multi-chip clock synchronization device of claim 1, wherein the reference clock supply unit is configured to generate the reference clock outside the plurality of chips such that the reference clock is supplied to the plurality of chips equally, the target clock generation unit is individually disposed inside each of the plurality of chips, and the target clock generation unit disposed inside each of the plurality of chips is configured to generate the target clock having the second frequency for each of the plurality of chips.

3. The multi-chip clock synchronization device of claim 2, wherein the reference clock supply unit is configured to transmit the reference clock to the plurality of chips simultaneously.

4. The multi-chip clock synchronization device of claim 2, wherein the reference clock supply unit is configured to supply the reference clock to each of the plurality of chips through a clock input terminal of each of the plurality of chips.

5. The multi-chip clock synchronization device of claim 2, wherein the number of the target clock generation units disposed inside the plurality of chips is same as the number of plurality of chips.

6. The multi-chip clock synchronization device of claim 2, wherein the target clock generation unit disposed in each of the plurality of chips is configured to generate the target clock having the second frequency using the following equation: F_SYS=F_REF×N where F_SYS is a target clock frequency of a system, F_REF is a reference clock frequency, and N is a natural number.

7. The multi-chip clock synchronization device of claim 2, wherein the target clock generation unit disposed inside each of the plurality of chips includes:

a phase frequency detector configured to receive the reference clock and a clock multiplied by N times and detect a phase difference between the reference clock and the clock multiplied by N times;

a voltage control oscillator configured to control a phase of the clock multiplied by N times based on the phase difference detected by the phase frequency detector to output the target clock having the second frequency; and a clock frequency multiplier configured to multiply a frequency of the clock whose phase is controlled by the voltage control oscillator by N times to feed back the clock multiplied by N times to the phase frequency detector.

8. The multi-chip clock synchronization device of claim 7, wherein the target clock generation unit disposed inside each of the plurality of chips further includes a filter unit that is electrically connected between the phase frequency detector and the voltage control oscillator to remove noise from a clock signal.

9. The multi-chip clock synchronization device of claim 2, wherein a plurality of target clock generation units is disposed to correspond to each chip of the plurality of chips, and the plurality of target clock generation units is configured to multiply the frequency of the target clock by the same multiple to generate the target clock of the same second frequency.

10. The multi-chip clock synchronization device of claim 1, wherein the plurality of chips includes a master chip and a plurality of slave chips, the master chip includes the reference clock supply unit, the master chip is configured to generate the reference clock and supply, through a clock output terminal of the master chip, the reference clock to the plurality of slave chips, and the target clock generation unit is individually disposed inside each of the master chip and the plurality of slave chips and configured to generate the target clock having the second frequency for each of the plurality of chips.

11. The multi-chip clock synchronization device of claim 10, wherein the reference clock supply unit includes:

a vibrator;

a vibrator driver configured to drive the vibrator to output a vibration frequency; and a clock distribution part configured to divide the vibration frequency based on a preset division rate to generate the reference clock having the first frequency.

12. The multi-chip clock synchronization device of claim 11, wherein the vibrator has one end connected to an input terminal of the master chip and the other end connected to an output terminal of the master chip.

13. The multi-chip clock synchronization device of claim 11, wherein the clock distribution part is configured to generate the reference clock having the first frequency using the following equation: F_REF=F_XOCS/R, where F_REF is the first frequency, F_XOCS is the vibration frequency, and R is the division rate.

14. The multi-chip clock synchronization device of claim 10, wherein the reference clock supply unit is individually disposed inside each of the master chip and the plurality of slave chips, the reference clock supply unit disposed inside the master chip is turned on to be activated so as to generate the reference clock, and the reference clock supply unit disposed inside each of the plurality of slave chips is turned off to be inactivated so as not to generate the reference clock.

15. The multi-chip clock synchronization device of claim 14, wherein the reference clock supply unit of the master chip is configured to transmit the reference clock to a clock input terminal of each of the plurality of slave chips through a clock output terminal of the master chip, and the reference clock inputted to each of the plurality of slave chips is inputted to the target clock generation unit disposed inside each of the plurality of slave chips.

16. The multi-chip clock synchronization device of claim 10, wherein the reference clock supply unit is individually disposed inside each of the master chip and the plurality of slave chips, the reference clock supply unit disposed inside the master chip is turned on to be activated so as to generate the reference clock, and the reference clock supply unit disposed inside each of the plurality of slave chips is turned off and is configured to buffer the reference clock inputted from the master chip to supply to the target clock generation unit.

17. The multi-chip clock synchronization device of claim 16, wherein the reference clock supply unit of the master chip transmits the reference clock to an input terminal for connecting a vibrator of each slave chip through the clock output terminal of the master chip, and the reference clock is input to a vibrator driver for buffering the clock of the reference clock supply unit disposed inside the slave chip.

18. A multi-chip clock synchronization method comprising:

generating a reference clock having a first frequency which is N times lower than a second frequency of a target clock;

supplying the reference clock having the first frequency to each of multiple chips;

generating the target clock having the second frequency by multiplying the first frequency of the reference clock in each of the multiple chips by N times when the reference clock of the first frequency is input to each chip; and synchronizing clocks of the multiple chips based on a target clock having the second frequency;

wherein the first frequency is determined as a lowest frequency of the reference clock if a jitter is generated when the first frequency of the reference clock is multiplied by N times, and wherein the first frequency of the reference clock is determined to be low when a total number of the plurality of chips increases, thereby reducing power consumption due to clock transmission.

19. A display device comprising:

a touch panel in which a plurality of touch sensors is disposed;

a touch driving device configured to drive the plurality of touch sensors; and a multi-chip clock synchronization device configured to apply a target clock to a plurality of chips of the touch driving device to synchronize clocks of the plurality of chips, wherein the multi-chip clock synchronization device includes:

a reference clock supply unit connected to a plurality of chips and supplying a reference clock of a first frequency to each chip of the plurality of chips; and a target clock generation unit configured to generate a target clock of a second frequency based on the reference clock of the first frequency input to each chip, wherein the reference clock supply unit is configured to generate the reference clock of the first frequency which is N times lower than the second frequency of the target clock to supply the generated reference clock to each chip, the target clock generation unit is configured to multiply the first frequency of the reference clock by N times when the reference clock of the first frequency is input to generate the target clock of the second frequency, the reference clock supply unit is configured to determine the first frequency as a lowest frequency of the reference clock if a jitter is generated when the target clock generation unit multiplies the first frequency of the reference clock by N times, and the reference clock supply unit is further configured to determine the first frequency of the reference clock to be low when a total number of the plurality of chips increases, thereby reducing power consumption due to clock transmission.

20. The display device of claim 19, further comprising:

a display panel on which a plurality of pixels is disposed;

a data driving device configured to drive data lines connected to the plurality of pixels;

a gate driving device configured to drive gate lines connected to the plurality of pixels; and a data processing device configured to transmit video data and a data control signal to the data driving device, wherein the multi-chip clock synchronization device is configured to apply the target clock to a plurality of chips of at least one of the data driving device, the gate driving device, and the data processing device to synchronize clocks of the plurality of chips of said at least one of the data driving device, the gate driving device, and the data processing device.

* * * * *